United States Patent [19]

Pfiester et al.

[11] Patent Number: 5,324,960
[45] Date of Patent: Jun. 28, 1994

[54] DUAL-TRANSISTOR STRUCTURE AND METHOD OF FORMATION

[75] Inventors: James R. Pfiester; James D. Hayden, both of Austin, Tex.

[73] Assignee: Motorola, Inc., Schaumburg, Ill.

[21] Appl. No.: 5,965

[22] Filed: Jan. 19, 1993

[51] Int. Cl.$^5$ .................... H01L 27/01; H01L 27/12; H01L 27/02

[52] U.S. Cl. .................... 257/67; 257/368; 257/369; 257/393; 257/903; 257/401

[58] Field of Search ............ 257/67, 368, 369, 393, 257/900, 903, 401, 412

[56] References Cited

U.S. PATENT DOCUMENTS

| | | | |
|---|---|---|---|
| 4,554,572 | 11/1985 | Chatterjee | 357/42 |
| 4,729,002 | 3/1988 | Yamazaki | 257/379 |
| 4,918,510 | 4/1990 | Pfiester | 257/70 |
| 4,997,785 | 3/1991 | Pfiester | 437/57 |
| 5,039,622 | 8/1991 | Ishihara | 437/41 |
| 5,041,886 | 8/1991 | Lee | 357/23.5 |
| 5,047,812 | 9/1991 | Pfiester | 357/23.4 |
| 5,095,347 | 3/1992 | Kirsch | 357/23.7 |
| 5,096,845 | 3/1992 | Inoue | 437/40 |
| 5,101,250 | 3/1992 | Arima et al. | 357/23.5 |
| 5,128,731 | 7/1992 | Lien et al. | 357/23.5 |

OTHER PUBLICATIONS

Impact of Surrounding Gate Transistor (SGT) for Ultra-High-Density LSI's, by Hiroshi Takato et al., was published in IEEE Trans. on Electron Devices, vol. 38, No. 3, Mar. 1991, pp. 573-577.

"Silicon-On-Insulator Gate-All-Around Device", by Colinge et al., 1990 IEEE IEDM, pp. 595-598.

*Primary Examiner*—Mark V. Prenty
*Attorney, Agent, or Firm*—Keith E. Witek

[57] ABSTRACT

A transistor structure (10) has a substrate (12). A first transistor is formed within the substrate (12) having a source region (38), a drain region (30), and a gate electrode formed by a first spacer (26a). A second transistor is formed within the substrate (12) by the source region (38), a drain region (28), and a gate electrode formed by a second spacer (26a). A third transistor is formed overlying the first transistor. The third transistor has a source region (34a), a drain region (34c), a channel region (34b), and a gate electrode formed by the first spacer (26a). A fourth transistor is formed overlying the second transistor. The fourth transistor has a source region (34a), a drain region (34c), a channel region (34b), and a gate electrode formed by the second spacer (26a). The first, second, third, and fourth transistors may be interconnected to form a portion of a compact static random access memory (SRAM) cell.

24 Claims, 4 Drawing Sheets

DUAL-TRANSISTOR STRUCTURE AND METHOD OF FORMATION

CROSS REFERENCE TO RELATED APPLICATIONS

Related subject matter may be found in the following copending cases:

(1) U.S. patent application Ser. No. 07/902,216, entitled "Self-Aligned Thin Film Transistor and Method of Formation", by Cooper et al., filed on Jun. 22, 1992; and (2) U.S. patent application Ser. No. 07/925,136, entitled "A Sidewall Resistive Device and Method of Formation", by Sheng et al., filed on Aug. 06, 1992.

FIELD OF THE INVENTION

The present invention relates generally to semiconductor technology, and more particularly, to a semiconductor metal oxide semonductor (MOS) transistor structure.

BACKGROUND OF THE INVENTION

Memory cells within integrated circuits (ICs) are continually shrinking in order to achieve increased packing density and future generations of memory ICs. In order to achieve increased packing density, several transistors must be formed within an increasingly smaller area. Several transistors are formed into a smaller surface area by combining functionality (i.e. sharing gates, double gating, sharing source and/or drain electrodes), vertically stacking devices (i.e. using thin film transistors (TFTs) or silicon on insulator (SOI) technology), using more compact transistor technology (i.e. using vertical transistor), and/or the like. For example, thin film transistors (TFTs) are transistors which are formed above the substrate within a polysilicon layer. Thin film transistors are usually stacked on top of other transistors which are formed within the substrate. This stacking achieves a high packing density. Thin film transistors (TFTs) are lithographically formed (i.e. have lithographically defined source, drain, and gate regions). Lithography limits the minimum size to which a device can be formed. Therefore, as memory arrays approach smaller cell sizes, even lithographically-defined undergated and over-gated TFTs will be too large for use within memory cells.

In order to improve density and reduce process complexity, TFTs are formed having a gate which also functions as a gate for another transistor. This method of sharing gate electrodes between two transistors allows for a reduction in the number of interconnect and gate layers and also reduces cell size. In most cases, a lithographically-defined gate which gates a planar formed transistor (i.e. a transistor formed via lithography within the substrate) functions also as a gate for an overlying TFT. Furthermore, a TFT drain of a first TFT may be used to gate a TFT channel of a second TFT and vice-versa. Once again the TFT gates are lithographically aligned/formed and are therefore no less than roughly 0.25 micron to 0.5 micron in dimensions. Lithographically-formed structures and lithographic alignment tolerances can severely limit memory cell size.

In order to further reduce the size of transistors and memory cells, vertical transistors may be used for memory cell formation. Many vertical transistors exist in the art and are usually formed by one of either trench processing or epitaxial/selective growth. Vertical transistors are in some cases difficult to form and difficult to integrate into a memory cell without using complex processing. In most cases, the formation of vertical transistors depends largely on lithography.

An improved structure is therefore required to reduce transistor top-down surface area and to reduce memory cell size.

SUMMARY OF THE INVENTION

The previously mentioned disadvantages are overcome and other advantages achieved with the present invention. In one form, the present invention comprises a dual-transistor device. A substrate is provided. A first transistor is formed at least partially within the substrate. The first transistor has a source, a drain, and a sidewall spacer formation functioning as a gate electrode. A second transistor is formed overlying the first transistor and has a source and a drain. The second transistor uses the sidewall spacer formation as a gate electrode.

The present invention will be more clearly understood from the detailed description below in conjunction with the accompanying drawings.

DESCRIPTION OF A PREFERRED EMBODIMENT

Figure 1:
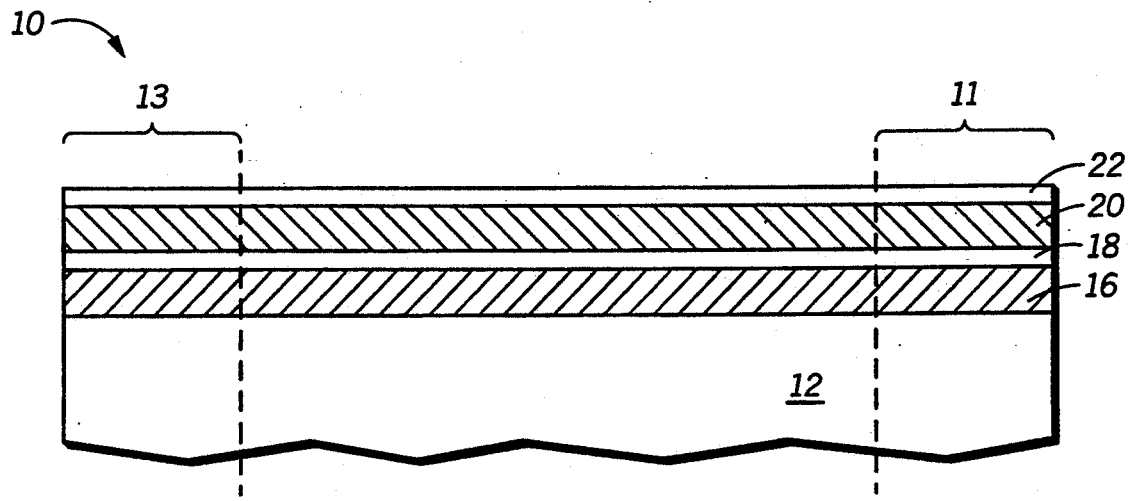
FIGS. 1-8 illustrate, in cross-sectional form, a method for forming a dual-transistor structure in accordance with the present invention.

Illustrated in FIG. 1 is a structure suitable for the formation of a dual-transistor structure 10. Structure 10 has a substrate 12. Substrate 12 may be made of silicon, gallium arsenide, silicon on sapphire (SOS), epitaxial formations, germanium, germanium silicon, diamond, silicon on insulator (SOI) material, and/or like substrate materials. Preferably, the substrate 12 is made of silicon which is typically single crystalline. An isolation region 11 and an isolation region 13 are illustrated. In the regions 11 and 13 an isolation structure is formed. Local oxidation of silicon (LOCOS), trench isolation, field shield isolation, polysilicon buffered LOCOS (PBL), frame masked PBL, polysilicon encapsulated LOCOS, or like isolation structures may be used.

A conductive layer 16 is formed overlying the substrate 12. Conductive layer 16 is preferably a polysilicon or amorphous silicon layer, but may be a germanium silicon layer, a silicided layer, a salicided layer, a doped silicon layer, an epitaxial material, a selectively grown layer of semiconductive material, or the like. A dielectric layer 18 is formed overlying the conductive layer 16. The dielectric layers described herein may be wet or dry silicon dioxide ($SiO_2$), a nitride material, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$), titanium oxide, oxynitride, and/or like dielectric materials. Specific dielectrics are noted herein when a specific dielectric material is preferred or required. Preferably, layer 18 is an oxide layer such as a TEOS-based oxide.

A conductive layer 20 is formed overlying the dielectric layer 18. The conductive layer 20 is similar to conductive layer 16 in dimensions and composition of material. A dielectric layer 22 is formed overlying the conductive layer 20. The dielectric layer 22 is preferably a nitride material such as silicon nitride.

Figure 2:
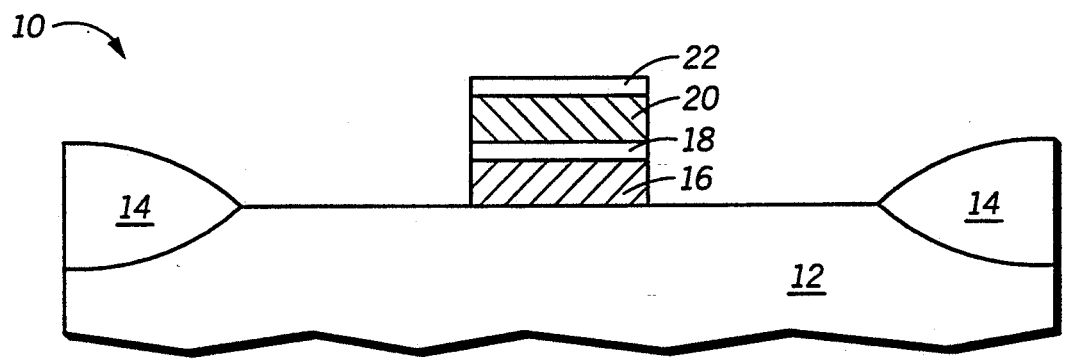

In FIG. 2, the isolation regions 11 and 13 of FIG. 1 are illustrated as containing field oxide regions 14. Field oxide regions 14 are formed by conventional LOCOS techniques or like isolation techniques.

In FIG. 2, the layers 16, 18, 20, and 22 are masked by a layer or photo-sensitive material (not illustrated), such as photoresist (not illustrated), and etched to form a patterned stack of materials. The etching of the layers 16, 18, 20, and 22 forms sidewalls of the conductive layers 16 and 20. Depending upon the materials chosen for conductive layer 16, etching selective to the substrate 12 may be difficult. Therefore, trenching of the substrate 12 may occur in regions adjacent the layer 16 in FIG. 2. This trenching may have an advantage which is discussed in a subsequent paragraph.

Figure 3:
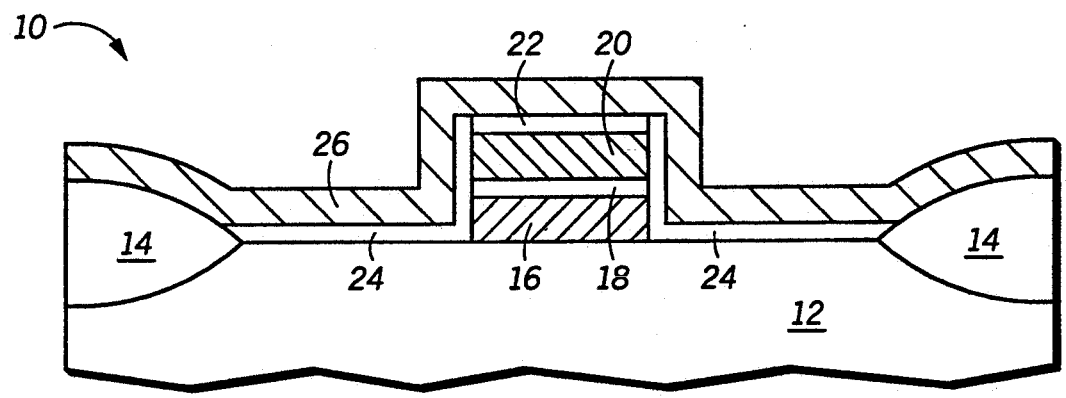

In FIG. 3 a dielectric layer 24 is grown and/or deposited overlying a surface of the substrate 12 and laterally adjacent the sidewalls of conductive layers 16 and 20. An optional spacer (not illustrated) may be formed laterally adjacent the sidewalls of the conductive layers 16 and 20 or adjacent the dielectric layer 24. A conductive layer 26 is formed overlying the dielectric layer 24, and is preferably formed from polysilicon or amorphous silicon. A blanket ion implantation step or in-situ doping may be used to uniformly dope the conductive layer 26 to a specific conductivity and conductivity type (i.e. N-type or P-type). The conductive layer 26 is preferably doped as N-type material and is typically on the order of a few hundred Angstroms in thickness to several thousand Angstroms in thickness.

Figure 4:
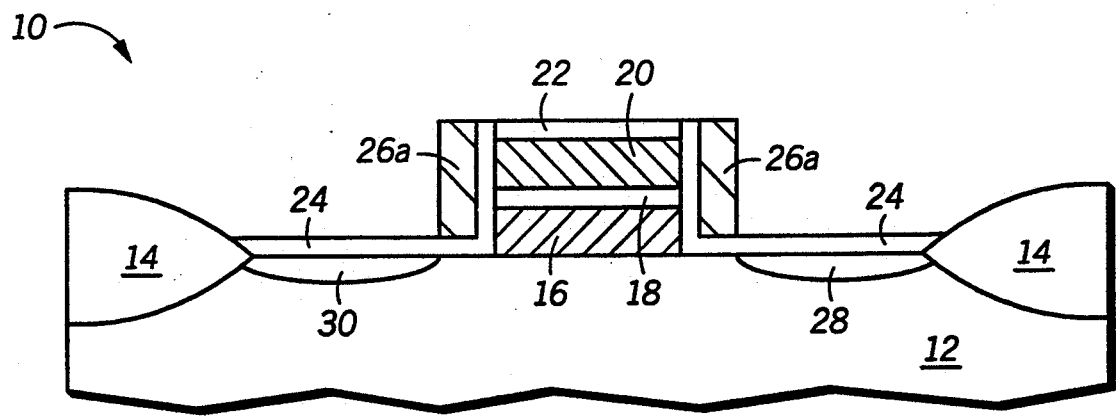

In FIG. 4, the conductive layer 26 is etched by a reactive ion etch (RIE) or a like etch process to form a sidewall spacer 26a. The spacer 26a will surround the feature defined by the patterned portions of the layers 16, 18, 20, and 22. The circular continuity of the spacer is not beneficial in structure 10. Therefore, a mask and etch process (usually an isotropic etch process) is used to separate the spacer 26a into two portions. Therefore, the sidewall spacer 26a is hereafter referred to as sidewall spacers 26a (i.e. two spacers, one on each side of the patterned portions of layers 16, 18, 20, and 22). The thickness of the spacers 26a may range from 300 Angstroms to over 2000 angstroms depending upon the initial thickness of the conductive layer 26. Preferably, the spacers 26a are made thin in order to reduce the surface area of structure 10.

An ion implant step is used to form drain regions 28 and 30 within the substrate 12 in a self-aligned manner.

Figure 5:
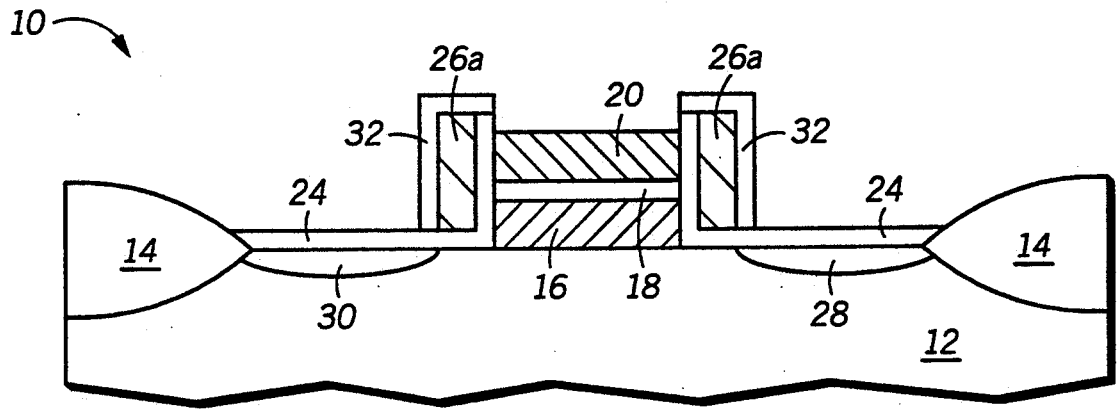

In FIG. 5, the dielectric layer 22 is removed by a selective etch process. A dielectric layer 32 is formed over all exposed portions of the sidewall spacers 26a. The sidewall spacers 26a are therefore fully insulated by the dielectric layers 24 and 32. Preferably, the layer 32 is a grown silicon dioxide or a grown polysilicon dioxide (polyox) layer, a deposited oxide layer, or a composite grown/deposited oxide.

Figure 6:
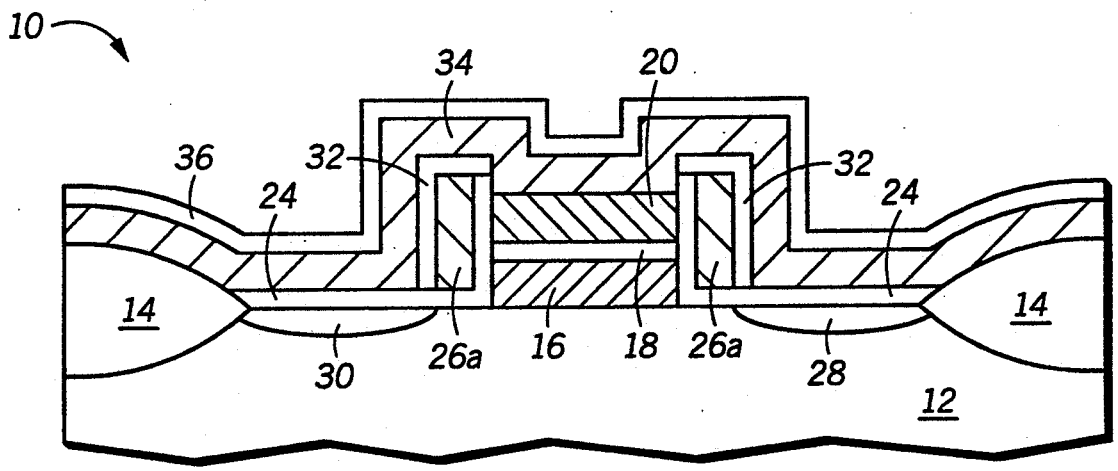

In FIG. 6, a conductive layer 34 is formed overlying the dielectric layers 24 and 32. Conductive layer 34 is preferably polysilicon or amorphous silicon and is either insitu doped or blanket ion implanted to a conductivity and conductivity type (i.e. N-type or P-type). Typical dopant atoms are boron, arsenic, and/or phosphorus. The layer 34 is typically doped as an N-type layer of material due to the fact that layer 32 is used, in most cases, to form P channel transistors. Unless the conductive layer 34 is laser recrystallized silicon, epitaxial silicon, or the like, then any transistor formed within conductive layer 34 is considered to be a thin film transistor (TFT) similar to the polysilicon TFTs used in static random access memories (SRAMs).

A dielectric layer 36 is formed overlying the conductive layer 34. Dielectric layer 36 is formed as a TEOS-based oxide or a like layer of material.

Figure 7:
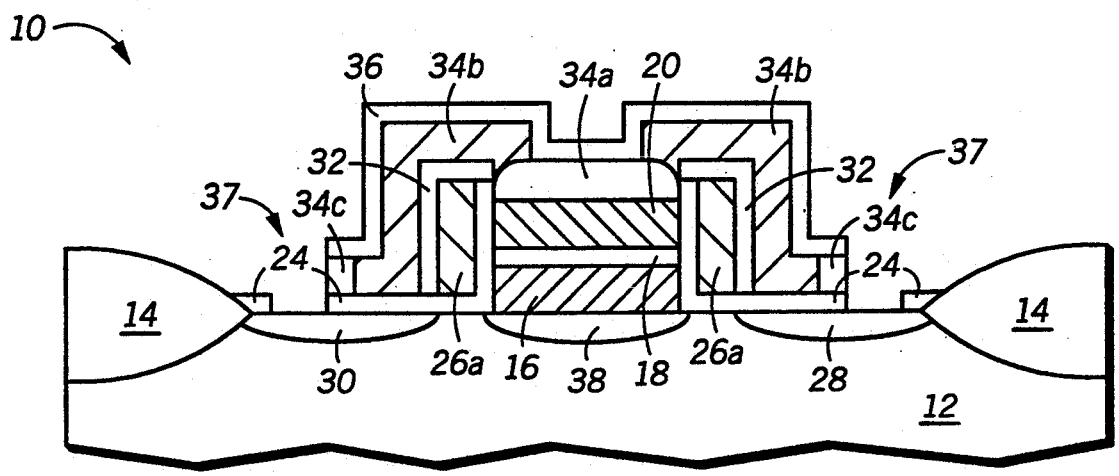

In FIG. 7, a masking layer (not illustrated) is formed and patterned overlying the spacers 26a and the dielectric layer 36. The masking layer (not illustrated) is used to mask an ion implant step which is used to form doped regions referred to as drain regions 34c. One or more masking and etch steps are used via at least one masking layer (not illustrated) to form openings 37 through the dielectric layers 36 and 24 and the conductive layer 34. The openings form exposed portions of the drain regions 28 and 30.

A heat cycle is used to drive dopant atoms out of conductive layer 16 into the substrate to form a ground contact or source region 38. Simultaneously, a diffusion region referred to as one of either a power supply region or a source region 34a is formed via the same heat cycle. Region 34a and regions 34c define boundaries of two channel regions 34b within layer 34. Therefore, layer 34 forms two silicon on insulator transistors or TFTs. One transistor overlies one of the spacers 26a and the other transistor overlies the other spacer 26a. The spacers 26a function as gates for the transistors formed within layer 34.

Two transistors are also formed within the substrate 12. One of the spacers 26a forms a gate electrode between the drain region 30 and the source region 38. Another of the spacers 26a forms a gate electrode between the drain region 28 and the source region 38. Channel regions are defined between the source region 38 and the drain region 28 and between the source region 38 and the drain region 30. It is known in the art that source and drain electrodes are usually symmetrical and may be interchanged without loss of functionality. The four transistors illustrated in FIG. 7 may each be formed as either N-channel or P-channel transistors. In many cases, the two transistors formed within the substrate will be formed as N-channel transistors and the two transistors formed from conductive layer 34 will be P-channel transistors or vice versa.

Figure 8:
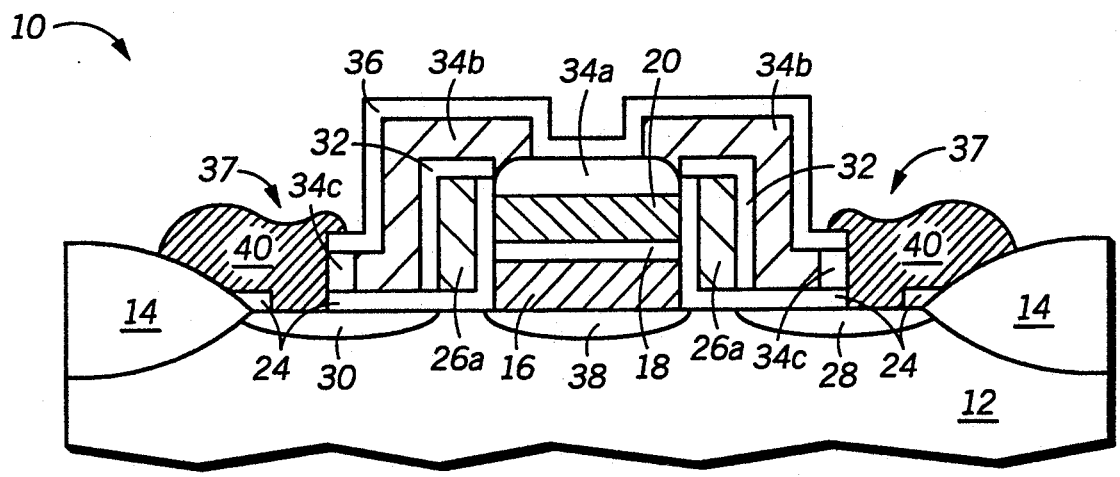

In FIG. 8, openings 37 are at least partially filled with a conductive material 40. Conductive material 40 functions as an interconnect layer. Material 40 may be titanium nitride, a metal, a polysilicon layer, a silicided layer, a salicided layer, or a like conductor or semiconductor. In some cases, the layer 40 may be a composite material of several conductive layers, barrier layers, etch stop layers, polish stop layers, and/or the like. Material 40 may be selectively deposited or blanket deposited and subsequently masked and etched. Chemical mechanical polishing (CMP) may be used to form plug regions, planarized contacts, Damascene interconnects, or the like. An oxide layer (not illustrated) may be optionally formed and optionally reflowed or planarized before etching the openings 37 in FIG. 7. This extra oxide layer (not illustrated) will produce improved isolation and planarity.

The conductive material 40 connects the drain regions 34c to the drain regions 30 and 28, respectively. Any PN junctions resulting from electrical contacts between regions 24c, 30, and 28 may be electrically short circuited by using a material 40 which contains a metallic compound. In another form a sidewall spacer or sidewall oxidation process may be used to isolate the drain regions 34c from the drain regions 38 and 30.

Structure 10 of FIG. 8 may be used to form a compact SRAM cell. To form an SRAM cell, the two transistors within the substrate 12 are formed as N-channel transistors and function as latch transistors for an SRAM cell. The two transistors formed within the conductive layer 34 are formed as P-channel TFTs or P-channel transistors and function as pull-up transistors in the SRAM cell. Each of the two regions formed by the conductive material 40 is connected to a different pass transistor (not illustrated). The conductive layer 20 supplies a power supply potential, and the conductive layer 16 supplies a ground potential.

In general, the trenching which occurs in the substrate 12 in FIG. 2 may be used to contain/minimize the diffusion of dopant atoms from the conductive layer 16 (i.e. contain the lateral diffusion of source region 38). The trenching will also increase the channel length of the pass transistors formed within the substrate 12 to ensure that the source region 38 and drain regions 28 and 30 do not electrically short circuit to one another.

Figure 9:
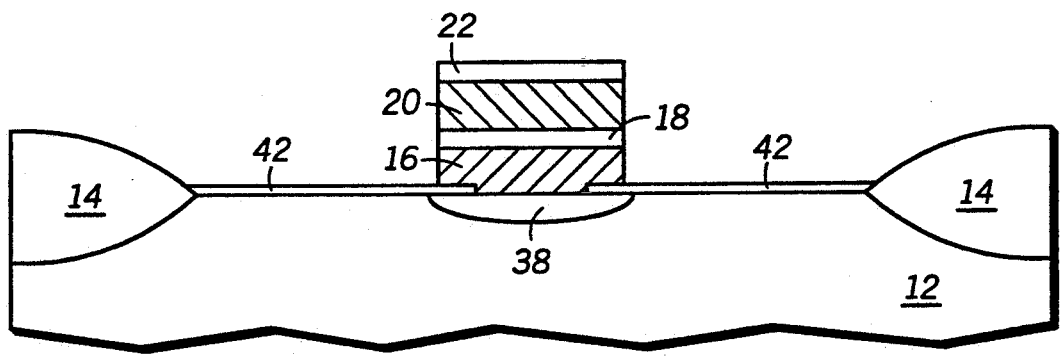
FIG. 9 illustrates, in cross-sectional form, an etch stop layer for use within the dual-transistor structure of FIGS. 1-8.

FIG. 9 illustrates that an etch stop layer 42 having an opening (not labeled) may be used to form a device similar to that illustrated in FIG. 2 without resulting in trenching of the substrate 12. The etch stop layer 42 is typically a grown silicon dioxide layer and is on the order of 50-350 Angstroms thick.

Figure 10:
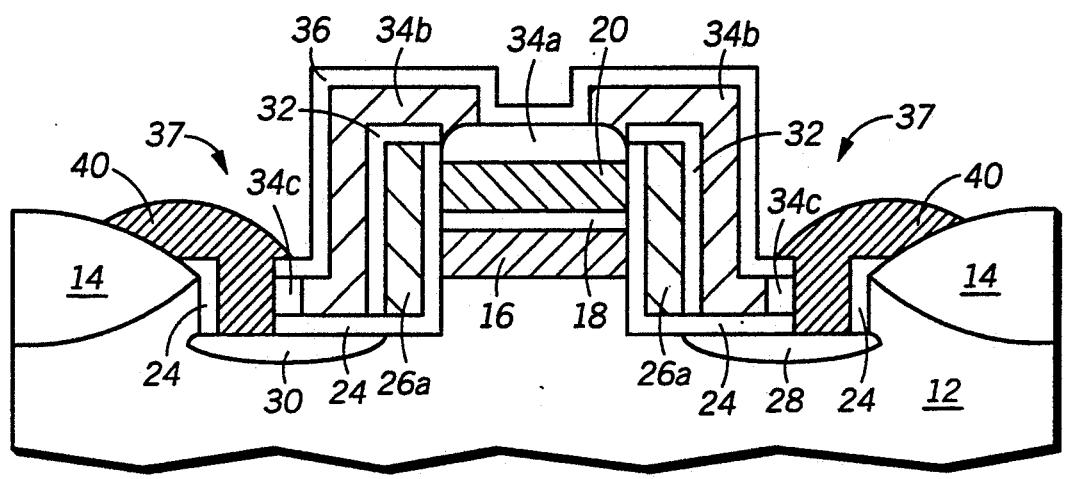
FIG. 10 illustrates, in cross-sectional form, a dual-transistor structure in accordance with the present invention.

FIG. 10 illustrates a dual-transistor structure wherein the source and drain regions are trenched into the substrate. This trenching increases the channel length of the substrate formed transistors. This increase in channel length may further stabilize an SRAM cell. Furthermore, thermal cycle constraints placed on back-end processing are relaxed due to the fact that diffusions formed within the substrate 12 are separated by a greater distance.

While the present invention has been illustrated and described with reference to specific embodiments, further modifications and improvements will occur to those skilled in the art. For example, the transistors taught herein may be formed as either N-channel or P-channel transistors. SOI transistors, TFT transistors, or polysilicon-formed transistors may be formed. The structure described herein may be used for other applications besides SRAM cells, such as logic circuits, inverters, and the like. The order in which operations are performed in the above description may be altered and still result in the same functional structure. For example, diffusions could be formed by a heat cycle before or after forming contacts to sources and drains. Various oxides in the structure listed above are used for gate oxides and others are used for isolation purposes. The thickness of the isolation oxides may be adjusted and optimized based upon an application in order to provide adequate isolation. The thicknesses of the gate oxides may be any thickness within the approximate range of 50 Angstroms to 400 Angstroms. It is to be understood, therefore, that this invention is not limited to the particular forms illustrated and that it is intended in the appended claims to cover all modifications that do not depart from the spirit and scope of this invention.

What is claimed is:

1. A dual-transistor device comprising:
   a substrate having a surface;
   a first transistor at least partially within the substrate, the first transistor having a source, a drain, and a sidewall spacer formation functioning as a gate electrode, the sidewall spacer formation having a width which is substantially within a range of 300 Angstroms to 2000 Angstroms;
   a second transistor, which has a source and a drain, formed overlying the first transistor, the second transistor using the sidewall spacer formation as a gate electrode, the sidewall spacer formation has both a first surface which is substantially parallel to the substrate and electrically controls the first transistor, and a second surface which is substantially perpendicular to the surface of the substrate and electrically controls the second transistor; and
   a patterned feature adjacent the sidewall spacer formation, the patterned feature making electrical contact to the second transistor.

2. The device of claim 1 wherein the second transistor is formed as a thin film transistor (TFT) made of a material which comprises silicon.

3. The device of claim 1 wherein the patterned feature is overlying the substrate, the patterned feature having sidewalls which are adjacent the sidewall spacer.

4. The device of claim 3 wherein the patterned feature comprises a conductive layer which supplies one of either a ground potential or a power supply potential to said device.

5. The device of claim 3 wherein the patterned feature comprises a first conductive layer which supplies a first voltage potential and a second conductive layer overlying the first conductive layer which supplies a second voltage potential, the second voltage potential being different from the first voltage potential.

6. The device of claim 1 further comprising:
   a third transistor at least partially within the substrate, the third transistor having a source, a drain, and a second sidewall spacer formation functioning as a gate electrode, the source of the third transistor is electrically coupled to the source of the first transistor; and
   a fourth transistor, which has a source and drain, formed overlying the third transistor, the fourth transistor using the second sidewall spacer formation as a gate electrode, the source of the fourth transistor being electrically coupled to the source of the second transistor.

7. The device of claim 1 wherein said device comprises a plurality of electrical interconnections which connect the device to form a portion of a static random access memory (SRAM) cell.

8. A transistor structure comprising:
   a substrate having a surface;
   a first source region and a first drain region formed within the substrate;
   a first channel region separating the first source region and the first drain region;
   a patterned feature formed overlying the substrate, the patterned feature having a sidewall and having a first conductive layer which supplies a first voltage potential and a second conductive layer overlying the first conductive layer which supplies a second voltage potential which is different from the first voltage potential;

a conductive spacer formed adjacent the sidewall of the patterned feature, overlying the first channel region, and functioning as a first gate electrode which gates the first channel region, the conductive spacer having both a height along a first axis which is substantially perpendicular to the surface of the substrate and a width along a second axis which is substantially parallel to the surface of the substrate, the height being greater than the width;

a second source region and a second drain region formed overlying the substrate; and a second channel region separating the second source region and the second drain region, the second channel region being adjacent the conductive spacer whereby the conductive spacer is used as a second gate electrode to gate the second channel region.

9. The transistor structure of claim 8 wherein the second source region, the second drain region, and the second channel region are each formed overlying the substrate and are formed within a conductive layer which comprises silicon.

10. The transistor structure of claim 8 wherein the conductive spacer has both a first surface, which is substantially parallel to the substrate and electrically controls the first channel region, and a second surface, which is substantially perpendicular to the surface of the substrate and electrically controls the second channel region.

11. The transistor structure of claim 8 wherein the conductive spacer has a width which is substantially within a range of 300 Angstroms to 2000 Angstroms.

12. The transistor structure of claim 11 wherein the patterned feature comprises a conductive layer which supplies one of either a ground potential or a power supply potential to said device.

13. The transistor structure of claim 8 wherein the transistor structure is used to form a static random access memory cell (SRAM cell).

14. The transistor structure of claim 8 further comprising:
a third source region and a third drain region formed within the substrate, the third source region and the first source region being electrically coupled by a first conductive region;
a third channel region separating the third source region and the third drain region;
a second conductive spacer formed overlying the third channel region and functioning as a third gate electrode which electrically controls the third channel region;
a fourth source region and a fourth drain region formed overlying the substrate, the fourth source region and the second source region being electrically coupled by a second conductive region; and
a fourth channel region separating the fourth source region and the fourth drain region, the fourth channel region being adjacent the second conductive spacer, the second conductive spacer functions as a fourth gate electrode to gate the fourth channel region.

15. The transistor structure of claim 8 wherein said device comprises a plurality of electrical interconnections which connect the device to form a portion of a static random access memory (SRAM) cell.

16. A transistor structure comprising:
a substrate having a surface;
a patterned feature overlying the substrate, the patterned feature having a sidewall which is substantially perpendicular to the surface of the substrate, the patterned feature having:
a first portion of the patterned feature which is used to provide a first voltage potential to the transistor structure; and
a second portion of the patterned feature which is used to provide a second voltage potential to the transistor structure, the second voltage potential being different from the first voltage potential;
a sidewall spacer of contiguous conductive material laterally adjacent the sidewall of the patterned feature, the sidewall spacer having a first surface and a second surface;
a first source region and a first drain region separated from the first source region by a first channel region within the substrate, the first channel region being electrically controlled by the first surface of the sidewall spacer; and
a second source region and a second drain region separated from the second source region by a second channel region which overlies the substrate, the second channel region being electrically controlled by the second surface of the sidewall spacer.

17. The transistor structure of claim 16 further comprising:
a plurality of electrical interconnections which connect the transistor structure to form a portion of a static random access memory (SRAM) cell.

18. The transistor structure of claim 16 wherein the first portion of the patterned feature is formed as a conductive layer which supplies a potential selected from the group consisting of: a ground potential and a power supply potential.

19. The transistor structure of claim 16 wherein the first and second portions of the patterned feature are each formed from a polysilicon material.

20. A transistor structure comprising:
a silicon substrate having a surface;
a patterned layer of material overlying the substrate, the patterned layer of material having a sidewall which is substantially perpendicular to the surface of the substrate, the patterned layer of material having:
a first portion of the patterned layer of material which is used to provide a ground potential to the transistor structure; and
a second portion of the patterned layer of material which is used to provide a power supply voltage potential to the transistor structure, the power supply voltage potential being greater than the ground potential;
a sidewall spacer of contiguous polysilicon material laterally adjacent the sidewall of the patterned layer of material, the sidewall spacer having a first surface and a second surface;
a first source region and a first drain region separated from the first source region by a first channel region within the substrate, the first channel region being electrically controlled by the first surface of the sidewall spacer; and
a second source region and a second drain region separated from the second source region by a second channel region which overlies the substrate, the second channel region being electrically controlled by the second surface of the sidewall spacer.

21. The transistor structure of claim 17 further comprising:
a plurality of electrical interconnections which connect the transistor structure to form a portion of a static random access memory (SRAM) cell.

22. The transistor structure of claim 20 wherein the patterned layer of material is formed from at least one layer of polysilicon.

23. A dual-transistor device comprising:
a substrate having a surface;
a patterned feature formed overlying the substrate, the patterned feature having a first conductive layer which supplies a first voltage potential and a second conductive layer overlying the first conductive layer which supplies a second voltage potential, the second voltage potential being different from the first voltage potential;
a first transistor at least partially within the substrate, the first transistor having a source, a drain, and a sidewall spacer formation formed adjacent the patterned feature which functions as a gate electrode; and
a second transistor, which has a source and a drain, formed overlying the first transistor, the second transistor using the sidewall spacer formation as a gate electrode, the sidewall spacer formation has both a first surface which is substantially parallel to the substrate and electrically controls the first transistor, and a second surface which is substantially perpendicular to the surface of the substrate and electrically controls the second transistor.

24. A dual-transistor device comprising:
a substrate having a surface;
a first transistor at least partially within the substrate, the first transistor having a source, a drain, and a sidewall spacer formation functioning as a gate electrode, the sidewall spacer formation having a width which is substantially within a range of 300 Angstroms to 2000 Angstroms;
a second transistor, which has a source and a drain, formed overlying the first transistor, the second transistor using the sidewall spacer formation as a gate electrode, the sidewall spacer formation has both a first surface which is substantially parallel to the substrate and electrically controls the first transistor, and a second surface which is substantially perpendicular to the surface of the substrate and electrically controls the second transistor; and
a patterned feature overlying the substrate, the patterned feature having sidewalls which are adjacent the sidewall spacer, the patterned feature having a first conductive layer which supplies a first voltage potential and a second conductive layer overlying the first conductive layer which supplies a second voltage potential, the second voltage potential being different from the first voltage potential.

* * * * *